(12) United States Patent
Potter

(10) Patent No.: US 7,217,582 B2
(45) Date of Patent: May 15, 2007

(54) METHOD FOR NON-DAMAGING CHARGE INJECTION AND A SYSTEM THEREOF

(75) Inventor: Michael D. Potter, Churchville, NY (US)

(73) Assignee: Rochester Institute of Technology, Rochester, NY (US)

( * ) Notice: Subject to any disclaimer, the term of this patent is extended or adjusted under 35 U.S.C. 154(b) by 187 days.

(21) Appl. No.: 10/924,611

(22) Filed: Aug. 24, 2004

(65) Prior Publication Data

US 2005/0079640 A1    Apr. 14, 2005

Related U.S. Application Data

(60) Provisional application No. 60/498,827, filed on Aug. 29, 2003.

(51) Int. Cl.
*H01L 21/00* (2006.01)

(52) U.S. Cl. ............................ 438/19; 438/48; 438/778; 438/795; 257/E21.192

(58) Field of Classification Search .................. 438/19, 438/48–53, 778, 795, E21.192; 427/255.37
See application file for complete search history.

(56) References Cited

U.S. PATENT DOCUMENTS

| | | | |
|---|---|---|---|
| 2,567,373 A | 9/1951 | Giacoletto et al. | |
| 2,588,513 A | 3/1952 | Giacoletta | |
| 2,978,066 A | 4/1961 | Nodolf | |
| 3,118,022 A | 1/1964 | Sessler et al. | |
| 3,397,278 A | 8/1968 | Pomerantz | |
| 3,405,334 A | 10/1968 | Jewett et al. | |
| 3,487,610 A | 1/1970 | Brown et al. | |
| 3,715,500 A | 2/1973 | Sessler et al. | |
| 3,731,163 A | 5/1973 | Shuskus | |
| 3,742,767 A | 7/1973 | Bernard et al. | |
| 3,786,495 A | 1/1974 | Spence | |
| 3,858,307 A | 1/1975 | Yoshimura et al. | |
| 3,924,324 A | 12/1975 | Kodera | |
| 4,047,214 A | 9/1977 | Francombe et al. | |
| 4,102,202 A | 7/1978 | Ferriss | |
| 4,115,914 A | 9/1978 | Harari | |
| 4,126,822 A | 11/1978 | Wahlstrom | |

(Continued)

FOREIGN PATENT DOCUMENTS

JP    58-029379 A    2/1983

(Continued)

OTHER PUBLICATIONS

Aguilera et al., "Electron Energy Distribution at the Insulator-Semiconductor Interface in AC Thin Film Electroluminescent Display Devices," *IEEE Transactions on Electron Devices* 41(8):1357-1363 (1994).

(Continued)

*Primary Examiner*—Savitri Mulpuri
(74) *Attorney, Agent, or Firm*—Nixon Peabody LLP

(57) ABSTRACT

A method and system for injecting charge includes providing a first material on a second material and injecting charge into the first material to trap charge at an interface between the first and second materials. The thickness of the first material is greater than a penetration depth of the injected charge in the first material.

9 Claims, 3 Drawing Sheets

U.S. PATENT DOCUMENTS

| | | |
|---|---|---|
| 4,160,882 A | 7/1979 | Driver |
| 4,166,729 A | 9/1979 | Thompson et al. |
| 4,285,714 A | 8/1981 | Kirkpatrick |
| 4,288,735 A | 9/1981 | Crites |
| 4,340,953 A * | 7/1982 | Iwamura et al. ............ 369/126 |
| 4,375,718 A | 3/1983 | Wadsworth et al. |
| 4,490,772 A | 12/1984 | Blickstein |
| 4,504,550 A | 3/1985 | Pook |
| 4,513,049 A | 4/1985 | Yamasaki et al. |
| 4,581,624 A | 4/1986 | O'Connor |
| 4,585,209 A | 4/1986 | Aine et al. |
| 4,626,263 A | 12/1986 | Inoue et al. |
| 4,626,729 A | 12/1986 | Lewiner et al. |
| 4,701,640 A | 10/1987 | Flygstad et al. |
| 4,716,331 A | 12/1987 | Higgins, Jr. |
| 4,736,629 A | 4/1988 | Cole |
| 4,789,504 A | 12/1988 | Ohmori et al. |
| 4,789,803 A | 12/1988 | Jacobsen et al. |
| 4,794,370 A | 12/1988 | Simpson et al. |
| 4,874,659 A | 10/1989 | Ando et al. |
| 4,905,701 A | 3/1990 | Cornelius |
| 4,922,756 A | 5/1990 | Henrion |
| 4,944,854 A | 7/1990 | Felton et al. |
| 4,945,068 A | 7/1990 | Sugaya |
| 4,958,317 A | 9/1990 | Terada et al. |
| 4,996,627 A | 2/1991 | Zias et al. |
| 4,997,521 A | 3/1991 | Howe et al. |
| 5,020,030 A | 5/1991 | Huber |
| 5,050,435 A | 9/1991 | Pinson |
| 5,051,643 A | 9/1991 | Dworsky et al. |
| 5,054,081 A | 10/1991 | West |
| 5,057,710 A | 10/1991 | Nishiura et al. |
| 5,081,513 A | 1/1992 | Jackson et al. |
| 5,082,242 A | 1/1992 | Bonne et al. |
| 5,088,326 A | 2/1992 | Wada et al. |
| 5,092,174 A | 3/1992 | Reidemeister et al. |
| 5,095,752 A | 3/1992 | Suzuki et al. |
| 5,096,388 A | 3/1992 | Weinberg |
| 5,108,470 A | 4/1992 | Pick |
| 5,112,677 A | 5/1992 | Tani et al. |
| 5,118,942 A | 6/1992 | Hamade |
| 5,129,794 A | 7/1992 | Beatty |
| 5,132,934 A | 7/1992 | Quate et al. |
| 5,143,854 A | 9/1992 | Pirrung et al. |
| 5,156,810 A | 10/1992 | Ribi |
| 5,164,319 A | 11/1992 | Hafeman et al. |
| 5,180,623 A | 1/1993 | Ohnstein |
| 5,189,641 A | 2/1993 | Arakawa |
| 5,207,103 A | 5/1993 | Wise et al. |
| 5,228,373 A | 7/1993 | Welsch |
| 5,231,045 A | 7/1993 | Miura et al. |
| 5,238,223 A | 8/1993 | Mettner et al. |
| 5,256,176 A | 10/1993 | Matsuura et al. |
| 5,262,000 A | 11/1993 | Welbourn et al. |
| 5,284,179 A | 2/1994 | Shikida et al. |
| 5,284,692 A | 2/1994 | Bell |
| 5,323,999 A | 6/1994 | Bonne et al. |
| 5,334,238 A | 8/1994 | Goodson et al. |
| 5,336,062 A | 8/1994 | Richter |
| 5,348,571 A | 9/1994 | Weber |
| 5,349,492 A | 9/1994 | Kimura et al. |
| 5,355,577 A | 10/1994 | Cohn |
| 5,365,790 A | 11/1994 | Chen et al. |
| 5,367,429 A | 11/1994 | Tsuchitani et al. |
| 5,380,396 A | 1/1995 | Shikida et al. |
| 5,392,650 A | 2/1995 | O'Brien et al. |
| 5,417,235 A | 5/1995 | Wise et al. |
| 5,417,312 A | 5/1995 | Tsuchitani et al. |
| 5,419,953 A | 5/1995 | Chapman |
| 5,441,597 A | 8/1995 | Bonne et al. |
| 5,445,008 A | 8/1995 | Wachter et al. |
| 5,474,599 A | 12/1995 | Cheney et al. |
| 5,488,864 A | 2/1996 | Stephan |
| 5,491,604 A | 2/1996 | Nguyen et al. |
| 5,496,507 A | 3/1996 | Angadjivand et al. |
| 5,512,882 A | 4/1996 | Stetter et al. |
| 5,519,240 A | 5/1996 | Suzuki |
| 5,520,522 A | 5/1996 | Rathore et al. |
| 5,526,172 A | 6/1996 | Kanack |
| 5,567,336 A | 10/1996 | Tatah |
| 5,578,976 A | 11/1996 | Yao |
| 5,591,679 A | 1/1997 | Jakobsen et al. |
| 5,593,476 A | 1/1997 | Coppom |
| 5,593,479 A | 1/1997 | Frey et al. |
| 5,596,194 A | 1/1997 | Kubena et al. |
| 5,616,844 A | 4/1997 | Suzuki et al. |
| 5,635,739 A | 6/1997 | Grieff et al. |
| 5,640,133 A | 6/1997 | MacDonald et al. |
| 5,668,303 A | 9/1997 | Giesler et al. |
| 5,671,905 A | 9/1997 | Hopkins, Jr. |
| 5,677,617 A | 10/1997 | Tokai et al. |
| 5,698,771 A | 12/1997 | Shields et al. |
| 5,739,834 A | 4/1998 | Okabe et al. |
| 5,747,692 A | 5/1998 | Jacobsen et al. |
| 5,771,148 A | 6/1998 | Davis |
| 5,777,977 A | 7/1998 | Fujiwara et al. |
| 5,788,468 A | 8/1998 | Dewa et al. |
| 5,793,485 A | 8/1998 | Gourley |
| 5,798,146 A | 8/1998 | Murokh et al. |
| 5,807,425 A | 9/1998 | Gibbs |
| 5,812,163 A | 9/1998 | Wong |
| 5,839,062 A | 11/1998 | Nguyen et al. |
| 5,846,302 A | 12/1998 | Putro |
| 5,846,708 A | 12/1998 | Hollis et al. |
| 5,871,567 A | 2/1999 | Covington et al. |
| 5,874,675 A | 2/1999 | Edmans et al. |
| 5,897,097 A | 4/1999 | Biegelsen et al. |
| 5,908,603 A | 6/1999 | Tsai et al. |
| 5,914,553 A | 6/1999 | Adams et al. |
| 5,919,364 A | 7/1999 | Lebouitz et al. |
| 5,920,011 A | 7/1999 | Hulsing, II |
| 5,941,501 A | 8/1999 | Biegelsen et al. |
| 5,955,932 A | 9/1999 | Nguyen et al. |
| 5,959,516 A | 9/1999 | Chang et al. |
| 5,967,163 A | 10/1999 | Pan et al. |
| 5,969,250 A | 10/1999 | Greiff |
| 5,971,355 A | 10/1999 | Biegelsen et al. |
| 5,993,520 A | 11/1999 | Yu |
| 5,994,982 A | 11/1999 | Kintis et al. |
| 6,007,309 A | 12/1999 | Hartley |
| 6,016,092 A | 1/2000 | Qiu et al. |
| 6,032,923 A | 3/2000 | Biegelsen et al. |
| 6,033,852 A | 3/2000 | Andle et al. |
| 6,037,797 A | 3/2000 | Lagowski et al. |
| 6,040,611 A | 3/2000 | De Los Santos et al. |
| 6,043,727 A | 3/2000 | Warneke et al. |
| 6,046,659 A | 4/2000 | Loo et al. |
| 6,048,692 A | 4/2000 | Maracas et al. |
| 6,051,853 A | 4/2000 | Shimada et al. |
| 6,057,520 A | 5/2000 | Goodwin-Johansson |
| 6,069,540 A | 5/2000 | Berenz et al. |
| 6,089,534 A | 7/2000 | Biegelsen et al. |
| 6,094,102 A | 7/2000 | Chang et al. |
| 6,100,477 A | 8/2000 | Randall et al. |
| 6,106,245 A | 8/2000 | Cabuz |
| 6,119,691 A | 9/2000 | Angadjivand et al. |
| 6,120,002 A | 9/2000 | Biegelsen et al. |
| 6,123,316 A | 9/2000 | Biegelsen et al. |
| 6,124,632 A | 9/2000 | Lo et al. |
| 6,126,140 A | 10/2000 | Johnson et al. |
| 6,127,744 A | 10/2000 | Streeter et al. |
| 6,127,812 A | 10/2000 | Ghezzo et al. |
| 6,149,190 A | 11/2000 | Galvin et al. |
| 6,168,395 B1 | 1/2001 | Quenzer et al. |

| | | |
|---|---|---|
| 6,168,948 B1 | 1/2001 | Anderson et al. |
| 6,170,332 B1 | 1/2001 | MacDonald et al. |
| 6,177,351 B1 | 1/2001 | Beratan et al. |
| 6,181,009 B1 | 1/2001 | Takahashi et al. |
| 6,197,139 B1 | 3/2001 | Ju et al. |
| 6,199,874 B1 | 3/2001 | Galvin et al. |
| 6,204,737 B1 | 3/2001 | Ellä |
| 6,214,094 B1 | 4/2001 | Rousseau et al. |
| 6,238,946 B1 | 5/2001 | Ziegler |
| 6,255,758 B1 | 7/2001 | Cabuz et al. |
| 6,265,758 B1 | 7/2001 | Takahashi |
| 6,275,122 B1 | 8/2001 | Speidell et al. |
| 6,287,776 B1 | 9/2001 | Hefti |
| 6,324,914 B1 | 12/2001 | Xue et al. |
| 6,336,353 B2 | 1/2002 | Matsiev et al. |
| 6,384,353 B1 | 5/2002 | Huang et al. |
| 6,393,895 B1 | 5/2002 | Matsiev et al. |
| 6,395,638 B1 | 5/2002 | Linnemann et al. |
| 6,423,148 B1 | 7/2002 | Aoki |
| 6,431,212 B1 | 8/2002 | Hayenga et al. |
| 6,469,785 B1 | 10/2002 | Duveneck et al. |
| 6,470,754 B1 | 10/2002 | Gianchandani |
| 6,485,273 B1 | 11/2002 | Goodwin-Johansson |
| 6,496,348 B2 | 12/2002 | McIntosh |
| 6,504,118 B2 | 1/2003 | Hyman et al. |
| 6,580,280 B2 | 6/2003 | Nakae et al. |
| 6,597,560 B2 | 7/2003 | Potter |
| 6,626,417 B2 | 9/2003 | Winger et al. |
| 6,638,627 B2 | 10/2003 | Potter |
| 6,673,677 B2 | 1/2004 | Hofmann et al. |
| 6,674,132 B2 | 1/2004 | Willer |
| 6,688,179 B2 | 2/2004 | Potter et al. |
| 6,707,355 B1 | 3/2004 | Yee |
| 6,717,488 B2 | 4/2004 | Potter |
| 6,734,770 B2 | 5/2004 | Aigner et al. |
| 6,750,590 B2 | 6/2004 | Potter |
| 6,773,488 B2 | 8/2004 | Potter |
| 6,787,438 B1 | 9/2004 | Nelson |
| 6,798,132 B2 | 9/2004 | Satake |
| 6,841,917 B2 | 1/2005 | Potter |
| 6,842,009 B2 | 1/2005 | Potter |
| 6,854,330 B2 | 2/2005 | Potter |
| 2001/0047689 A1 | 12/2001 | McIntosh |
| 2002/0000649 A1 | 1/2002 | Tilmans et al. |
| 2002/0012937 A1 | 1/2002 | Tender et al. |
| 2002/0072201 A1 | 6/2002 | Potter |
| 2002/0131228 A1 | 9/2002 | Potter |
| 2002/0131230 A1 | 9/2002 | Potter |
| 2002/0182091 A1 | 12/2002 | Potter |
| 2002/0185003 A1 | 12/2002 | Potter |
| 2002/0187618 A1 | 12/2002 | Potter |
| 2002/0197761 A1 | 12/2002 | Patel et al. |
| 2003/0079543 A1 | 5/2003 | Potter |
| 2003/0079548 A1 | 5/2003 | Potter et al. |
| 2003/0080839 A1 | 5/2003 | Wong |
| 2003/0081397 A1 | 5/2003 | Potter |
| 2003/0112096 A1 | 6/2003 | Potter |
| 2003/0201784 A1 | 10/2003 | Potter |
| 2004/0023236 A1 | 2/2004 | Potter et al. |
| 2004/0145271 A1 | 7/2004 | Potter |
| 2004/0155555 A1 | 8/2004 | Potter |
| 2005/0035683 A1 | 2/2005 | Raisanen |
| 2005/0044955 A1 | 3/2005 | Potter |
| 2005/0186117 A1 | 8/2005 | Uchiyama et al. |
| 2005/0205966 A1 | 9/2005 | Potter |

FOREIGN PATENT DOCUMENTS

| | | |
|---|---|---|
| JP | 62-297534 | 12/1987 |
| JP | 02-219478 A | 9/1990 |
| JP | 4-236172 | 8/1992 |
| JP | 08-308258 A | 11/1996 |
| JP | 2000-304567 A | 11/2000 |

OTHER PUBLICATIONS

Brown, et al., "A Varactor-Tuned RF Filter," *IEEE Trans. on MTT*, pp. 1-4 (1999).
Cass, S., "Large Jobs for Little Devices," *IEEE Spectrum*, pp. 72-73 (2001).
Cui, Z., "Basic Information in Microfluidic System: A Knowledge Base for Microfluidic Devices," retrieved from the internet at http://web.archive.org/web/20011015071501/http://www.ccmicro.rl.ac.uk/info_microfluidics.html (Oct. 15, 2001).
Ilic et al., "Mechanical Resonant Immunospecific Biological Detector," *Appl. Phys. Lett.* 77(3):450-452 (2000).
Ilic et al., "Single Cell Detection with Micromechanical Oscillators," *J. Vac. Sci. Technol. B* 19(6):2825-2828 (2001).
Judy et al., "Surface Machined Micromechanical Membrane Pump," *IEEE*, pp. 182-186 (1991).
Kobayashi et al., "Distribution of Trapped Electrons at Interface State in ACTFEL Devices," *in* Proceedings of the Sixth International Workshop on Electroluminescence, El Paso, Texas, May 11-13, 1992.
Laser & Santiago, "A Review of Micropumps," *J. Micromech. Microeng.* 14:R35-R64 (2004).
Shoji & Esashi, "Microflow Devices and Systems," *J. Micromech. Microeng.* 4:157-171 (1994).
http://ucsub.colorado.edu/~maz/research/background.html [Retrieved from Web site on Apr. 4, 2001].
"Low-Power, High-Performance MEMS-Based Switch Fabric," at http://www.ece.ncsu.edu/erl/damemi/switchproj.html [Retrieved from Web site on Apr. 4, 2001].
http://www.eecs.umich.edu/RADLAB/bio/rebeiz/Current_Research.html [Retrieved from Web site on Apr. 4, 2001].
"MEMS Technology Developers," at http://www.ida.org/DIVISIONS/std/MEMS/tech_fluids.html [Retrieved from the internet on Jun. 13, 2002].

* cited by examiner

METHOD FOR NON-DAMAGING CHARGE INJECTION AND A SYSTEM THEREOF

The present invention claims the benefit of U.S. Provisional Patent Application Ser. No. 60/498,827, filed Aug. 29, 2003, which is hereby incorporated by reference in its entirety.

The subject invention was made with government support (Infotonics Technology Center (DOE)) Award No. DEFG02-02ER63410.A100. The U.S. Government may have certain rights.

FIELD OF THE INVENTION

The present invention generally relates to charge injection and, more particularly, relates to a method for non-damaging charge injection and a system thereof.

BACKGROUND

Recently, a new class of Micro-Electrical-Mechanical Systems (MEMS) devices have been disclosed that utilize embedded electronic charge as a means for actuation or self-generating sensors, such as those disclosed in U.S. Pat. Nos. 6,597,560; 6,638,627; 6,688,179; 6,717,488; 6,750,590; and 6,773,488 and in US Patent Application Publication Nos.: 2002/0131228; 2002/0182091; 2003/0079543; 2003/0201784; and 2004/0023236 by way of example. Typically, charge is injected into the interface of dissimilar insulating materials by high electric field injection. Electrons "e-" are caused to tunnel into the conduction band of a material, such as silicon dioxide, from a silicon substrate via a high-applied electric field. The electrons "e-" become trapped at electronic trap sites at a composite insulator interface, such as an interface between silicon dioxide and silicon nitride. The charge remains trapped for an extremely long period of time and is therefore useful as MEMS enabling technology.

Embedded electronic charge is also useful for other macroscopic applications, such as, but not limited to, harvesting energy from the environment. These macroscopic structures include windmills that can convert the energy of wind into electrical power. However, for macroscopic structures it is impractical to embed electronic charge by tunneling into the conduction band of one member of insulating composite large structures. Typically, a suitable injecting interface, such as silicon to silicon dioxide, is not available.

One technique that has been investigated is to expose the structure to a beam of energetic particles such as an electron beam. With this technique, electrons "e-" impinge upon a surface of a composite insulating structure with sufficient energy to enter the system. These electrons "e-" are then trapped at trap sites at a dissimilar insulator interface.

Unfortunately, there is significant difficulty with this ballistic electron injection process. It is important that the energy of the arriving electrons "e-" be either below or above the range of energies where secondary electron yield is greater than unity. If the energy is within the range of greater than unity, a net positive charge can significantly affect the result. For example, positive charge within the outermost insulator layer, but close to the embedded electron charge will tend to empty the traps via internal high field, thus neutralizing the effective trapped charge. Furthermore, the simple presence of opposite sign charge in the vicinity of the trapped charge will tend to neutralize the effectiveness of the trapped charge.

Referring to FIG. 1, a graph of a secondary electron yield of silicon dioxide as a function of electron energy is shown. The data in the graph shows that the secondary electron yield is greater than unity from about 30 eV to approximately 3,800 eV. It is obvious any accelerating potential less than 30 eV does not have sufficient energy to substantially enter the system. Therefore, one must use energies greater than about 3,800 eV.

It is also desirable to create a system where the charge is as close to the surface as possible. As a result, the thickness of the outermost layer must be thin. However, as described above, the accelerating potential must be kept above the critical value of about 3,800 eV. With a thin outermost layer and the accelerating potential above about 3,800 eV, the penetration of the electrons "e-" may be too great.

Referring to FIG. 2, a graph of a Monte Carlo simulation of electron penetration into a composite 10 of a layer of silicon dioxide 12 on a layer of silicon nitride 14 on a layer of silicon dioxide 16 that is on a substrate 18 of silicon is illustrated. The layer of silicon dioxide 12, the layer of silicon nitride 14, and the layer of silicon dioxide 16 each have a thickness of about 100 nm. The thickness of the outermost layer of silicon dioxide 12 is chosen so that the average penetration depth of the arriving electrons "e-" is at the interface between the outermost layer of silicon dioxide 12 and the layer of silicon nitride 14. Unfortunately, this ballistic charge injection technique has not been shown to be effective.

Referring to FIGS. 3A and 3B, the capacitance-voltage (C-V) characteristics before and after the ballistic injection into the composite 10 are shown. The tests were performed on the composite 10 of a layer of silicon dioxide 12 on a layer of silicon nitride 14 on a layer of silicon dioxide 16 with the substrate 18 of n-type silicon with a liquid InGa top electrode. The ballistic injection parameters were 3 KeV, 100 sec., and 3,000 $\mu C/cm^2$ dose.

As the graphs in FIGS. 3A and 3B show, there is severe degradation in the post-injection characteristics of the composite 10. This is presumed to be due to morphological changes creating defects. These defects apparently have a wide energy distribution and significant dipole moment. Investigations have determined poor retention time of charge for these test structures. Furthermore, the maximum-trapped charge density for these investigations is much less than that achieved using high field tunneling. Since the accelerating potential was in the range of secondary electron yield greater than unity, a slight negative shift is observed indicating the presence of positive charge.

SUMMARY OF THE INVENTION

A method for injecting charge in accordance with embodiments of the present invention includes providing a first material on a second material and injecting charge into the first material to trap charge at an interface between the first and second materials. The thickness of the first material is greater than a penetration depth of the injected charge in the first material.

A system for injecting charge in accordance with embodiments of the present invention includes a first material on a second material with an interface between the first and second materials and a charge source positioned to inject charge into the first material to trap charge at an interface between the first and second materials. The thickness of the first material is greater than a penetration depth of the injected charge in the first material.

The present invention provides a system and method for injecting charge to fill the electronic traps at an interface between materials without causing deleterious effects on charge storing characteristics of the materials. The resulting structure with the trapped charge at an interface is particular useful for MEMS enabling technology, but can be used to inject charge in other types of devices.

DETAILED DESCRIPTION

Figure 1:
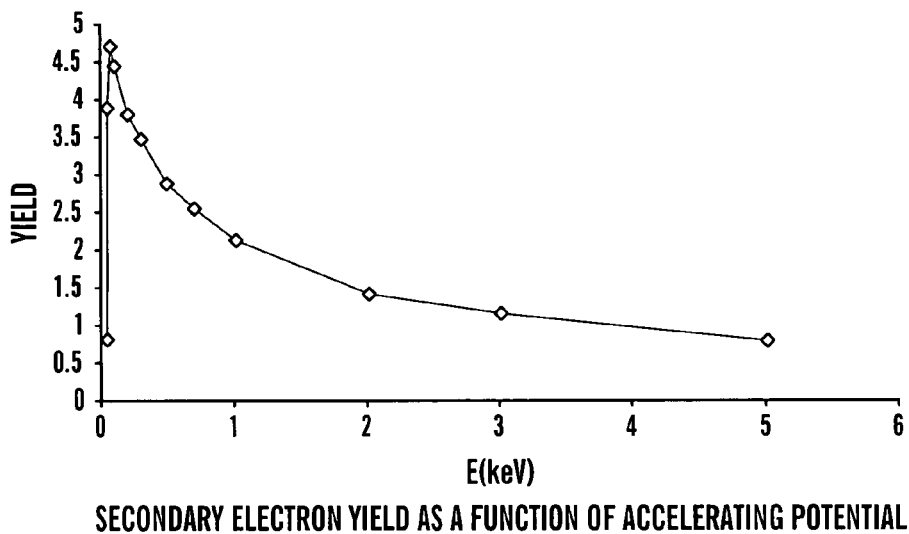
FIG. 1 is a graph of secondary electron yield as a function of accelerating potential.
Figure 2:
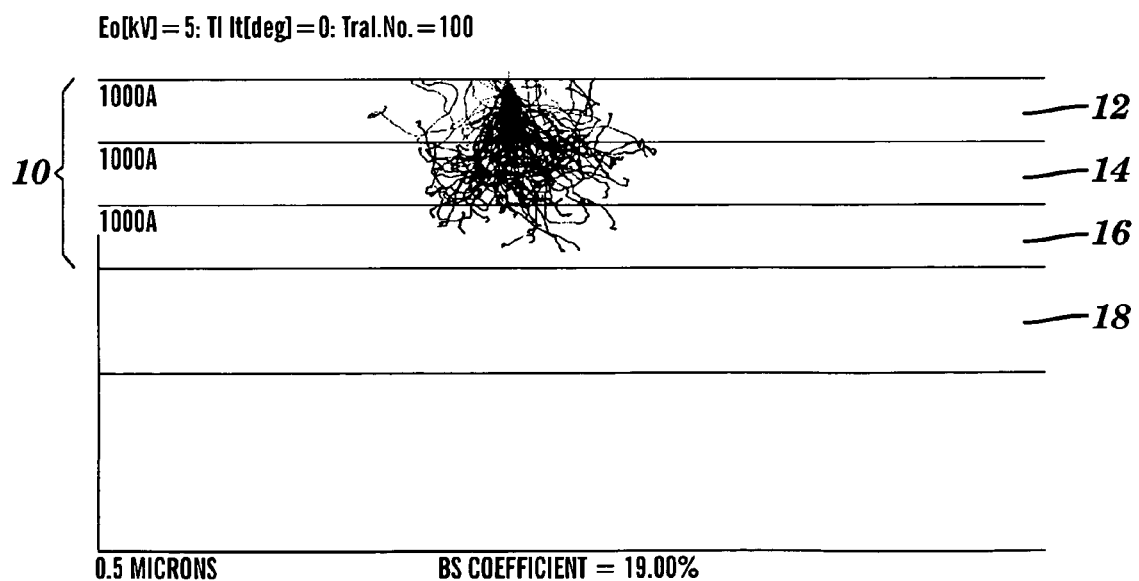
FIG. 2 is a graph of a Monte Carlo simulation of 5 KeV ballistic electron injection into a composite insulator.
Figures 3A, 3B:
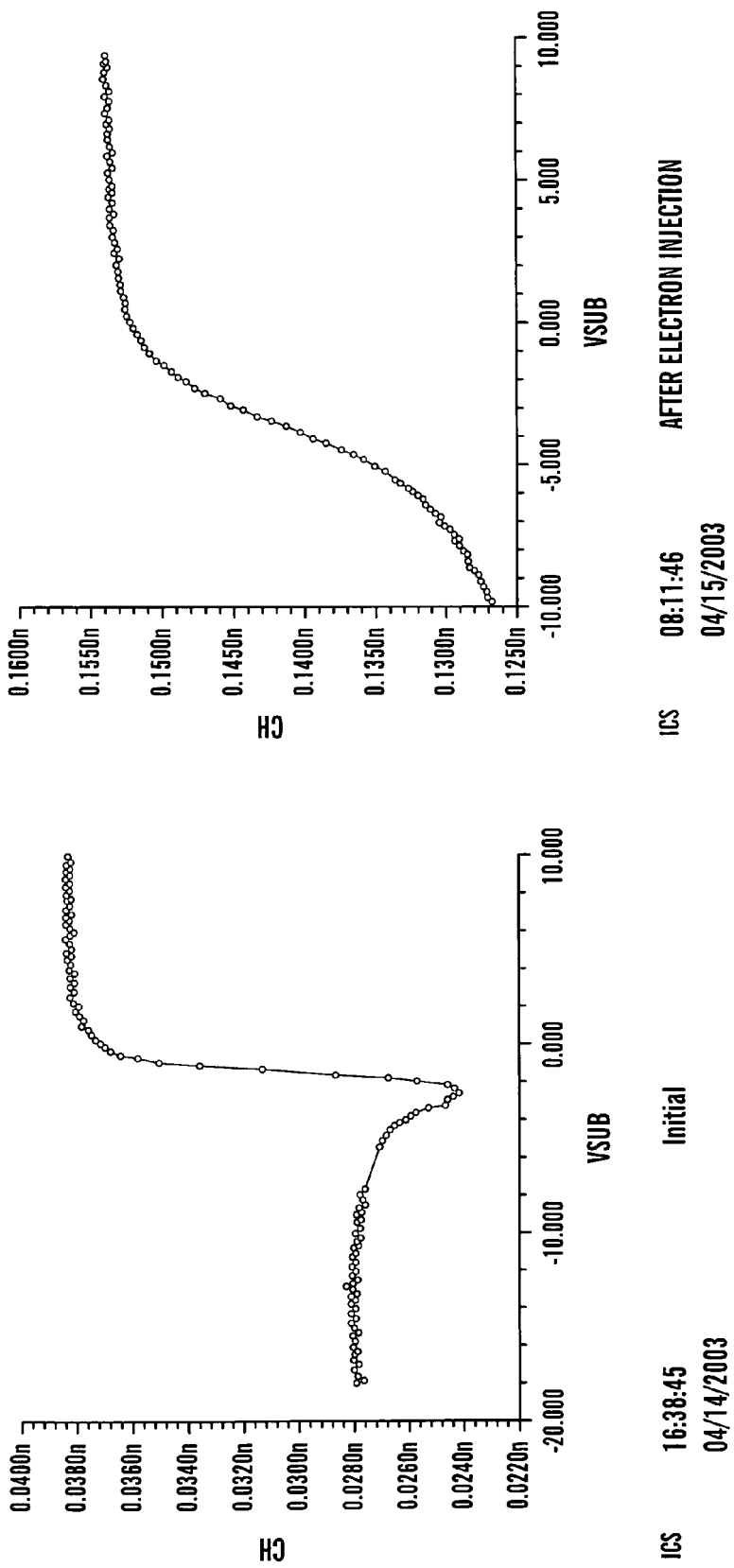
FIG. 3A is a graph of C-V characteristics in a composite insulator before electron injection.
FIG. 3B is a graph of C-V characteristics in a composite insulator after electron injection.
Figure 4:
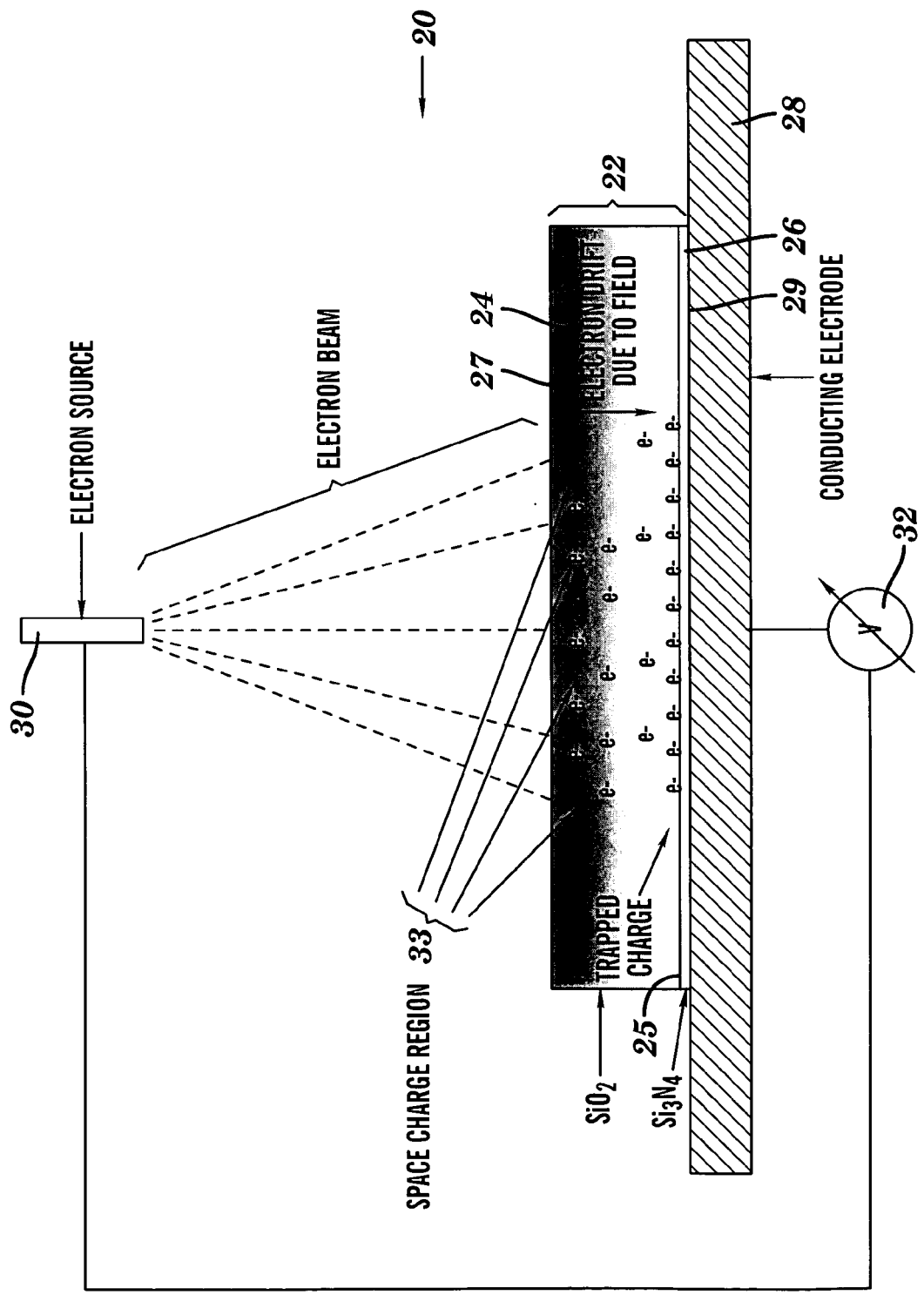
FIG. 4 is a system for non-damaging electron injection in accordance with embodiments of the present invention.

A system 20 for non-damaging electron injection in accordance with embodiments of the present invention is illustrated in FIG. 4. The system 20 includes a structure 22 comprising a layer of silicon dioxide ($SiO_2$) 24 on a layer of silicon nitride ($Si_3N_4$) 26, a conducting electrode 28, a ballistic electron source 30, and a power source 32, although the system 20 can comprise other types and numbers of components arranged in other manners. The present invention provides a number of advantages including providing a system 20 and method for injecting charge to fill the electronic traps at an interface 25 between layers 24 and 26 that does not cause deleterious effects on charge storing characteristics of the interface 25 between the layers 24 and 26 of the structure 22.

Referring more specifically to FIG. 4, the structure 22 comprises the layer of silicon dioxide ($SiO_2$) 24 on the layer of silicon nitride ($Si_3N_4$) 26, although other types and numbers of dissimilar insulating layers which are arranged in other manners can be used. An interface 25 is formed between the layer of silicon dioxide 24 and the layer of silicon nitride 26 at which the trapped charge is stored.

The thickness of the layer of silicon dioxide 24 from an outer surface 27 of the layer 24 to the interface 25 is about 500 micron, although the layer of silicon dioxide 24 could have other thicknesses. The thickness of the layer of silicon dioxide 24 is greater than a penetration depth of electrons "e-" injected into the layer of silicon dioxide 24 from the ballistic electron source 30. The layer of silicon nitride 26 has a thickness of about 100 nm in this example, although the layer of silicon nitride 26 can have other thicknesses.

The conducting electrode 28 is placed on another surface 29 of the layer of silicon nitride 26, although other manners for coupling the layer of silicon nitride 26 to the conducting electrode 28 can be used. A variety of different types of conducting materials can be used for the conducting electrode 28.

The ballistic electron source 30 is an electron flood gun for injecting electrons "e-", although other types of charge sources can be used and other types of charge can be injected. The ballistic electron source 30 is positioned and used to inject electrons "e-" through surface 27 into the layer of silicon dioxide 24. The energy of the electrons "e-" from the ballistic electron source 30 is above the energy where secondary electron yield is unity. In these embodiments, the level of energy is above 3,800 eV and may be on the order of 5,000 eV to 500,000 eV, although other levels of energy can be used. The injected electrons "e-" quickly will thermalize to the conduction band minimum of the layer of silicon dioxide 24. Since the number of injected electrons "e-" is substantially greater than the secondary electrons, a local negative space charge 33 is established. This will likewise establish an electric field between the space charge and the conducting electrode 28 that is substantially in contact with the surface 29 of the layer of silicon nitride 26.

The power source 32 applies a potential difference between the conducting electrode 28 and the electron source 30 which establishes an accelerating potential for the electrons "e-" or other charge being injected, although the power supply 32 can be coupled to provide power in other manners. An application of positive bias to the conducting electrode 28 by the power source 32 may enhance the electric field across the layer of silicon dioxide 24 and the layer of silicon nitride 26.

A method for non-damaging electron injection in accordance with embodiments of the present invention will now be described with reference to FIG. 4. The layer of silicon nitride 26 is deposited on to the layer of silicon dioxide 24, although the layers 24 and 26 can be formed in other manners. The layer of silicon dioxide 24 has a thickness which is greater than a penetration depth of electrons "e-" injected into the layer of silicon dioxide 24 from the ballistic electron source 30. The thickness for the layer of silicon dioxide 24 is determined by a Monte Carlo simulation taking into account the acceleration potential supplied by the power source 32 between the conducting electrode 28 and the electron source 30 and the materials properties of the layer being injected into, in this example the layer of silicon dioxide 24, although other techniques for determining the thickness of the layer so that it is greater than the penetration depth of the charge being injected can be used. The layer of silicon dioxide 24 on the layer of silicon nitride form the structure 22, although again the structure 22 can have other numbers and types of layers.

Next, the conducting electrode 28 is placed on the surface 29 of the layer of silicon nitride 26, although other manners for coupling the layer of silicon nitride 26 to the conducting electrode 28 can be used. The power source 32 is coupled to the conducting electrode 28 and to the ballistic electron source 30 to apply a potential difference between the conducting electrode 28 and the ballistic electron source 30 which establishes an accelerating potential for the charge, in these embodiments the electrons "e-". The applied accelerating potential is at a value where secondary electron yield is less than unity. The power source 32 may also apply a positive bias to the conducting electrode 28, although other biasing arrangements can be used, such as having the conducting electrode 28 coupled to ground.

The ballistic electron source 30 emits electrons "e-" in an electron beam towards the surface 27 of the layer of silicon dioxide 24, although other types of charge could be used. The electrons "e-" penetrate through the surface 27 and into the layer of silicon dioxide 24, but not to the interface 25 because the thickness of the layer of silicon dioxide 24 is greater than the substantial maximum penetration depth of the electrons "e-" being injected.

Electrons "e-" injected in the layer of silicon dioxide 24 from the ballistic electron source 30 migrate toward the interface 25 between the layer of silicon dioxide 24 and the layer of silicon nitride 26 because of an electric field from a space charge region 33 in the layer of silicon dioxide 24 to the conducting electrode 28. The layer of silicon dioxide 24 is a wide band gap material with a band gap of approximately 9 eV making it an excellent insulator. However, the layer of silicon dioxide 24 is basically a contact limited insulator. An electron in the conduction band of the layer of silicon dioxide 24 is actually reasonably mobile, on the order of 1 to 10 cm$^2$ per volt-second. As a result, the injected electrons "e-" quickly fill the traps at the interface 25 and remain there. Any morphological damage layer of silicon dioxide 24 is well away from the interface 25 between the layer of silicon dioxide 24 and the layer of silicon nitride 26 and will not degrade the characteristics of the trapped electrons, such as retention time. The trapped charge, in these embodiments electrons "e-", at the interface 25 is monopole charge.

If desired, a layer of photo resist or other protective material can be coated over the layer of silicon nitride 26 and a portion of the layer of silicon dioxide 24 may be etched away where the injection of the electrons "e-" caused damage. By way of example only, hydrofluoric acid, can be used to remove the damaged portion of the layer of the silicon dioxide 24, if desired. The layer of photo resist is then removed and the structure 22 is ready for use in applications.

Accordingly, as described above, the present invention provides a system 20 and method for injecting charge to fill the electronic traps at an interface 25 between layers 24 and 26 that does not cause deleterious effects on charge storing characteristics of the interface 25 between the layers 24 and 26 of the structure 22.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A method for injecting charge, the method comprising:
   providing a first material on a second material; and
   injecting charge into the first material to trap charge at an interface between the first and second materials, wherein a thickness of the first material is greater than a penetration depth of the injected charge in the first material, wherein the first and the second materials are dissimilar insulators.

2. The method as set forth in claim 1 further comprising:
   providing a conductor on the second material;
   providing a source for the injected charge which is positioned to direct the injected charge towards at least a portion of the first material; and
   applying an accelerating potential across the conductor and the source for the injected charge.

3. The method as set forth in claim 2 wherein the applied accelerating potential is at a value where secondary electron yield is less than unity.

4. The method as set forth in claim 2 wherein the applied accelerating potential is above 3800 eV.

5. The method as set forth in claim 1 further comprising determining the penetration depth of injected charge in the first material, wherein the providing further comprises depositing the first material on the second material to the thickness which is greater than the determined penetration depth.

6. The method as set forth in claim 1 further comprising removing a portion of the first material where the injected charge has penetrated.

7. The method as set forth in claim 6 further comprising coating at least a portion of the second material with a protective layer during the removal of the portion of the first material.

8. The method as set forth in claim 1 wherein the first material comprises $SiO_2$ and the second material comprises $Si_3N_4$.

9. The method as set forth in claim 1 wherein the charge trapped at the interface is monopole charge.

* * * * *